(12) United States Patent
Khoo et al.

(10) Patent No.: US 7,724,010 B2
(45) Date of Patent: May 25, 2010

(54) TORSION SPRING PROBE CONTACTOR DESIGN

(75) Inventors: Melvin Khoo, San Gabriel, CA (US); Nim Tea, Orange, CA (US); Salleh Ismail, Moorpark, CA (US); Yang Hsu, San Marino, CA (US); Weilong Tang, San Gabriel, CA (US); Raffi Garabedian, Monrovia, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 120 days.

(21) Appl. No.: 11/983,521

(22) Filed: Nov. 9, 2007

(65) Prior Publication Data
US 2008/0106289 A1 May 8, 2008

Related U.S. Application Data

(63) Continuation of application No. 11/194,801, filed on Aug. 1, 2005, now Pat. No. 7,362,119.

(51) Int. Cl.
*G01R 1/073* (2006.01)
(52) U.S. Cl. ...................... 324/762; 324/754
(58) Field of Classification Search ......... 324/754–765; 74/550; 33/31
See application file for complete search history.

(56) References Cited

U.S. PATENT DOCUMENTS 1,960,587 A * 5/1934 Johnson ................. 123/185.13

(Continued)

FOREIGN PATENT DOCUMENTS

EP 0567332 A2 10/1993
WO WO 2004/056698 A2 8/2004

OTHER PUBLICATIONS

Bang et al., Vertical Micro-probe Design Based on the EFABTM Micro-Fabrication Process, IEEE Southwest Test Workshop 2003, pp. 1-23, Jun. 1, 2003.
Yoon etal Monolithic Integration of 3D Electroplated Microstructures with Unlimited Number of Levels Using Planarization with a Scarificial Metallic Mold(PSMM) 624-629 Jan. 17, 1999.
U.S. Appl. No. 11/983,521, Melvin B. Khoo et al.
U.S. Appl. No. 11/986,453, Garabedian et al.

*Primary Examiner*—Ernest F Karlsen
(74) *Attorney, Agent, or Firm*—Holland & Hart LLP

(57) ABSTRACT

The present invention relates to a probe for making electrical connection to a contact pad on a microelectronic device. A foot having a length, a thickness, a width, a proximal end, and a distal end, is connected to a substrate. The length of the foot is greater than its width. A torsion bar having a length, a width, a thickness, a proximal end, and a distal end, is connected to the distal end of the foot at the proximal end of torsion bar. The torsion bar lies in a first plane. A spacer having a length, a width, and a thickness, is connected to the distal end of the torsion bar. An arm having a length, a width, a thickness, a proximal end, and a distal end is connected to said spacer at the arms proximal end. The arm lies in a second plane and the second plane is in a different plane than the first plane. A first post having a top side and a bottom side is connected to the arm near the distal end of the arm. A tip is electrically connected to the top side of the post.

21 Claims, 9 Drawing Sheets

U.S. PATENT DOCUMENTS

| | | | |
|---|---|---|---|
| 3,323,214 A * | 6/1967 | Sachsenhaus et al. ........... 33/31 |
| 3,806,801 A | 4/1974 | Bove |
| 4,161,692 A | 7/1979 | Tarzwell |
| 4,214,201 A | 7/1980 | Kern |
| 4,719,417 A | 1/1988 | Evans |
| 4,899,099 A | 2/1990 | Mendenhall et al. |
| 4,906,920 A | 3/1990 | Huff et al. |
| 5,152,695 A | 10/1992 | Grabbe et al. |
| 5,190,637 A | 3/1993 | Guckel |
| 5,191,708 A | 3/1993 | Kasukabe et al. |
| 5,513,430 A | 5/1996 | Yanof et al. |
| 5,613,861 A | 3/1997 | Smith et al. |
| 5,665,648 A | 9/1997 | Little |
| 5,811,982 A | 9/1998 | Beaman et al. |
| 5,926,951 A | 7/1999 | Khandros et al. |
| 5,953,306 A | 9/1999 | Yi |
| 5,973,394 A | 10/1999 | Slocum et al. |
| 6,232,669 B1 | 5/2001 | Khoury et al. |
| 6,245,444 B1 | 6/2001 | Marcus et al. |
| 6,307,392 B1 | 10/2001 | Soejima et al. |
| 6,414,501 B2 | 7/2002 | Kim et al. |
| 6,426,638 B1 | 7/2002 | Di Stefano |
| 6,482,013 B2 | 11/2002 | Eldridge et al. |
| 6,520,778 B1 | 2/2003 | Eldridge et al. |
| 6,616,966 B2 | 9/2003 | Mathieu et al. |
| 6,727,579 B1 | 4/2004 | Eldridge et al. |
| 6,736,665 B2 | 5/2004 | Zhou et al. |
| 6,771,084 B2 | 8/2004 | Di Stefano |
| 6,791,176 B2 | 9/2004 | Mathieu et al. |
| 6,799,976 B1 * | 10/2004 | Mok et al. ................... 439/55 |
| 6,809,539 B2 | 10/2004 | Wada et al. |
| 7,180,316 B1 | 2/2007 | Ismail et al. |
| 7,245,135 B2 | 7/2007 | Ismail et al. |
| 7,264,984 B2 | 9/2007 | Garabedian et al. |
| 7,271,022 B2 | 9/2007 | Tang et al. |
| 2005/0264312 A1 * | 12/2005 | Bohm et al. ................ 324/761 |
| 2007/0024298 A1 | 2/2007 | Khoo et al. |
| 2007/0057685 A1 | 3/2007 | Garabedian et al. |
| 2007/0075717 A1 | 4/2007 | Kinghorn et al. |
| 2007/0145988 A1 | 6/2007 | Garabedian et al. |
| 2007/0182430 A1 | 8/2007 | Ismail et al. |
| 2007/0240306 A1 | 10/2007 | Ismail et al. |

\* cited by examiner

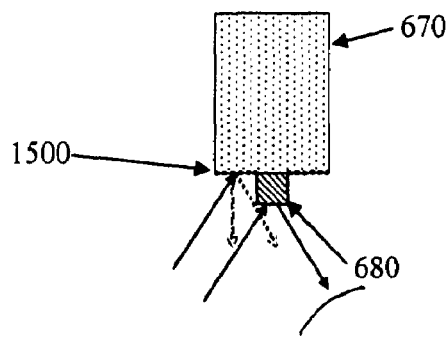
Figure 15
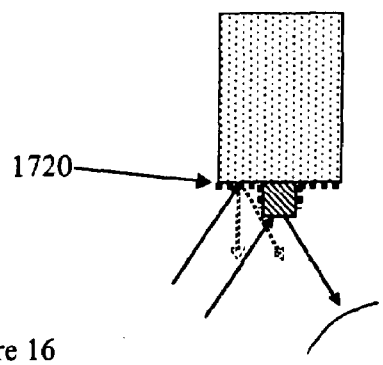
Figure 16
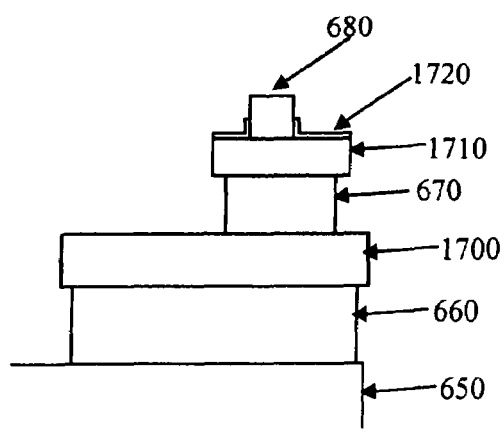 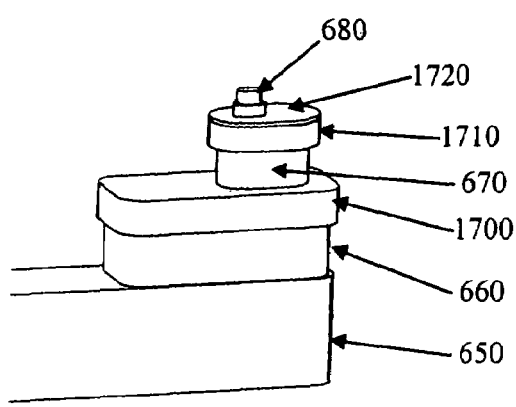
Figure 17B  Figure 17A

TORSION SPRING PROBE CONTACTOR DESIGN

RELATED APPLICATIONS

This application is a continuation application of U.S. patent application Ser. No. 11/194,801, filed Aug. 1, 2005 now U.S. Pat. No. 7,362,119.

BACKGROUND

The present invention relates generally to the testing of semiconductor chips, and specifically to the design of probe contactors for such testing prior to packaging.

Typically, semiconductor chips are tested to verify that they function appropriately and reliably. This is often done when the semiconductor devices are still in wafer form, that is, before they are diced from the wafer and packaged. This allows the simultaneous testing of many chips at a single time, creating considerable advantages in cost and process time compared to testing individual chips once they are packaged. If chips are found to be defective, then when the chips are diced from the wafer, the defective ones can be discarded and only the reliable chips are packaged. It is an axiom then that the larger a wafer that may be reliably tested at a time, the more savings can be incurred in cost and process time.

Generally, when performing wafer testing, a chuck carrying a wafer is raised to a probe card to which thousands of probes are electrically coupled. To test larger wafers, small, high performance probes are needed. The probes must be able to break through the oxide and debris layers on the surface of the contact pads of the chips on the wafer in order to make a reliable electrical contact to each pad. Additionally, the probes must be able to compensate for the fact that the contact pads may be of different heights (i.e., not all the contact pads on a wafer may reside in the same plane). Furthermore, the chuck and the probe card mechanical mount may not be precisely parallel and flat, introducing further height variations which the probes must accommodate.

Conventionally, cantilever wire probes have been used to test wafers in this regard. However, cantilever wire probes are too long and difficult to accurately assemble to allow reliable simultaneous contact to all of the chips on a conventional wafer. Additionally, cantilever wire probes have high self and mutual inductance problems which do not make them good candidates for testing of high-speed devices. These problems are exaggerated when they are used to test larger wafers. Cantilever (or bending) probes can also be fabricated at a small physical scale by various microfabrication techniques known in the art. These cantilever springs lack the mechanical energy density (for controlled scrubbing of the oxide layer) and spatial efficiency to be ideally effective for reliable testing of large wafers.

A number of attempts have been made to overcome the deficiencies of cantilever probes, all with varied levels of success. For instance, U.S. Pat. No. 5,926,951, assigned to Form Factor, Inc., describes methods of producing spring probes by coating a ductile metal with a spring metal (as seen in FIG. 4). These springs are bending mode springs similar to cantilever springs. Moreover, they are elongated and poorly supported in lateral directions at the contactor causing problems with controlled scrubbing of the contact pads. Furthermore, probes that require a long spring length such as these have relatively poor electrical performance.

U.S. Pat. No. 6,426,638, assigned to Decision Track, describes a torsion spring design, see FIG. 1, which is more mechanically efficient than other spring designs, and more effective than cantilever designs. U.S. Pat. No. 6,771,084, also assigned to Decision Track, describes the fundamental principle of a single footed torsion spring probe contactor, see FIGS. 2A and 2B. However these designs too, have their limitations. The particular incarnations considered and contemplated by these patents do not address or solve many of the practical requirements for a spring probe contactor such as: range of motion, optical characteristics required for vision recognition, practical production means, requirements for high lateral stability of the contact tip in response to scrubbing forces to name a few.

Improvements in the design of probe contactors have come with advances in photolithography and associated micromachining techniques. U.S. Pat. No. 5,190,637 to Wisconsin Alumni Research Foundation describes the basis of multilayer build up fabrication through lithographic electro-forming techniques of three-dimensional metal structures including springs and spring contactors. The present applicants have created a micro-formed torsion bar probe contactor which overcomes many of the deficiencies of the prior art and is a subject of the instant application.

Another aspect of the present application is the formation of the tip at the end of the probe. Older pin based contactors, such as cantilever needle probes or vertically buckling beam probes, are typically built from wire with a sharpened or shaped tip. This type of geometry provides for adequate electrical contact only if substantial contact force is applied. High contact force is deleterious to the semiconductor devices under test which often include active devices under the I/O pads. Furthermore, pin based contactors cannot be built at the fine pitches and high pin counts required for modern large wafer test. For these and other reasons, microfabricated probe contactors are an attractive alternative to pin based probe cards.

Microfabricated probe contact tips for use on contactor probes have been proposed in a variety of configurations and are plentiful in the art. In most of these configurations, provision is made for the creation of a tip with a well defined and controlled surface shape, size, material, and texture. Each of these elements is important for achieving the required consistent electrical contact to common IC pad metals such as Al, AlSiCu, Cu, Cu alloys, Au, or solder. Each of these parameters has a bearing on the contact performance but control over the geometry is among the most significant and is a function of the fabrication technology employed.

Another factor that is often overlooked is the optical characteristic of the tip and adjacent structures. Typically, probe cards are used in conjunction with wafer probers equipped with machine vision systems for automatic identification of probe tip locations and alignment of those to the I/O pads on the wafer, such as that described by U.S. Pat. No. 5,321,352, assigned to Tokyo Electron Labs. Basically, a machine vision system includes a camera that is positionable and looks at the tips of the probe needles. The camera has some magnification appropriate for viewing the geometry of the tip. It also includes a light source such as an LED ring light or a co-axial light. The image from the camera is processed by computer so as to determine the location of the tip relative to the camera's image area. This location information is used by the prober's computer control algorithm to position the DUT bond pads accurately under the probe tips. Thus the probe tip must be designed with the vision systems requirements in mind. In particular, vision systems require a good optical contrast between the tip and adjacent structures, particularly in the case of microfabricated contactors with small physical dimensions between adjacent surfaces. Typical microfabricated spring contactors have smooth planar surfaces in close proximity to the contact tip surface, creating difficulty with regard to the vision recognition systems due to reflections from surfaces other than the tip, as seen in FIG. 5A. Thus, these vision systems often mistake unrelated structures for the tip causing vision rejections or errors in the captured tip position.

Various attempts to overcome this problem have been suggested, but each have had their own problems. For instance, U.S. Pat. No. 6,255,126, assigned to Form Factor, Inc. and shown in FIGS. 3A and 3B, discloses a pyramid shaped contactor tip for use with a cantilever probe structure. The pyramid is formed by replicating an anisotropically etched cavity in silicon and bonding the replicated tip to a spring structure. While this technique may produce a tip with a good mechanical strength due to its wide base, and the sides of the pyramid reflect light off-axis and appear dark under the normal illumination used for machine vision recognition, this design has at least two significant drawbacks. The fabrication sequence is driven by a mold replication technique and requires a separate bonding step in order to assemble the tip to the spring. This extra bonding step adds significant complexity, yield loss, and cost to the manufacturing process. Furthermore, the pyramid shape produces a contact geometry that is limited to a square or rectangular contact surface which grows in size as it is abraded or re-surfaced as is often done in practical application as a result of abrasive cleaning. Any change in surface shape or size results in a change in contact area and hence electrical contact characteristics as well as scrub mark.

Another way of solving machine vision problems is to create the tip significantly tall (approximately 50 um tall). In this embodiment, the next underlying planar surface (the post) would be far enough away from the focal plane of the vision microscope so that the post surface would be out of focus and only the tip would be in focus. However, this is not a practical solution for tips that are produced by lithographic imaging and electroforming. Such processes have practical limits in aspect ratio (height to width ratio). Furthermore, even if the aspect ratios of a taller tip were practical (typical tips are about the same height as or slightly higher than their smallest dimension which is on the order of 5 um to 20 um), a taller tip would be prone to breakage from the lateral scrubbing forces present in use.

Another proposed alternative is to remove part of the post structure, creating a sloped surface around the tip, see FIG. 5B, that cannot reflect illumination back to the vision system. However, a problem with this design is that it is very difficult to align a tip on the flat top of the now tapered post. Any slight misalignment provides a planar reflective surface near the tip base and causes a bright "crescent" to appear around the tip. The crescent effect interferes with proper tip-position recognition causing vision "rejects" or errors in the captured visual centroid.

Thus a new design is needed for creating a tip and post structure that will resolve the issues of vision errors when a tip is lithographically formed on a probe structure.

SUMMARY OF THE INVENTION

Improvements upon the lithography techniques described in U.S. Pat. No. 5,190,637 are the subject of U.S. patent application Ser. Nos. 11/019,912 and 11/102,982, both commonly owned by the present applicant and hereby also incorporated by reference. Those two applications describe the use of general photolithographic pattern-plating techniques combined with the use of islands of sacrificial metals to further create microstructures such as probe contactors. Using the above techniques, the present applicants have created a micro-formed torsion bar probe contactor which overcomes many of the deficiencies of the prior art and that is a subject of the instant application.

The present invention is directed to a probe incorporating a torsion bar as a spring element and a tip and post structure that resolves current problems with automatic vision mechanisms. The torsion bar probe is formed on a substrate which will ultimately hold hundreds or thousands of probe elements. The probe is connected to the substrate by a foot. Attached to one end of the foot is a trace that electrically connects the foot to a via in the substrate, and at the other end of the foot, a torsion bar is attached. At the other end of the torsion bar, a spacer is attached, the spacer being taller than the torsion bar. Atop the spacer, an arm is attached. The arm is more rigid than the torsion bar, meaning that it does not significantly bend to store energy during use. Atop the arm, opposite the spacer, a post (or posts) are attached, and atop the post(s) is a tip, the structure of which will be described further below. A stop is built atop the substrate at a place near and below where the spacer and torsion bar are joined. There is a space or a gap between the torsion bar and the stop when the probe is in a non-actuated state (i.e., not pressed against a contact pad of a semiconductor device).

In operation, the tip is contacted by an I/O contact pad on a wafer and forced down (in the spatial orientation of the majority of the drawings) towards the substrate. As the tip is pushed down, the arm, which is designed to be mostly rigid, tilts causing the torsion bar to twist. The torsion bar is firmly affixed to the substrate at the foot end, and is supported both vertically and laterally, but free to rotate, at the stop end. Rotation at the stop end involves a slight motion of the torsion bar (through the gap distance of a few microns) until contact is made to the stop, after which point the torsion bar pivots against the stop. The overall geometry of the probe (including spacer height, arm length, post height, etc.) dictates the motion in space of the tip as it travels downward. The motion is largely in the form of an arc, providing a forward component (in a direction roughly orthogonal to the axis of the torsion bar) as the tip moves downward. The forward motion of the tip provides the "scrub" which is necessary in practice to achieve a good reliable and repeatable contact resistance to the I/O pad.

Utilizing the manufacturing processes described in U.S. patent application Ser. Nos. 11/019,912 and 11/102,982, the present invention includes several novel features not present in the prior art. One of the novel features of the present invention is that the arm portion is in a different planar layer than the torsion bar and may be separated from the torsion bar by a spacer. The addition of these two added layers provides for greater design flexibility towards controlling the path of motion of the tip when it is actuated by a largely vertical force when testing a device. The availability of additional layers of the probe in this respect is made possible by the new manufacturing processes described in the above patent applications. In fact, as described, the torsion probe has at least eight planar layers utilized in the construction of the torsion contactor spring and these layers afford design flexibility to optimize the operational characteristics of the contactor while accommodating the process limitations imposed by commercially viable photolithographic micro-electro-forming techniques. The torsion probe may have more or fewer layers than eight without departing from the spirit of this invention.

The arm of the probe is also made more rigid than the torsion bar so that it does not act as a spring (as in a cantilever beam spring). If the bar was not rigid, its deformation would increase the scrub length beyond that which may be desired.

The arm provides a lever which, in consort with the stop, transforms the largely linear arc of the tip to a nearly pure-torsion rotation of the torsion bar. In another embodiment, the arm is composed of two subarms, one extending from the top of the end of the other. This approach allows a greater clearance between the closest part of the spring structure and the wafer under test. Additional clearance helps to avoid damage to the wafer from foreign particles that may become caught between the probe structures and the wafer in the contacted state.

Another novel aspect of the present invention is that a stop is attached to the substrate and incorporates a lateral support to laterally support the torsion bar when it engages the stop. The basic function of the stop is to act as a fulcrum or pivot for the torsion bar. The lateral support provides an increase in lateral stability and more control over the tip's scrub pattern.

Another novel aspect of the present invention is the design of the tip and post structure. To ensure that the machine vision systems can accurately differentiate the tip from the post when both have planar surfaces, the top portion of the post, to which the tip is coupled, is treated in such a way that it diffuses or absorbs incident light. This can be accomplished several ways, such as through rough plating (such as with high current plating with or without the addition of grain refiners) or metallographic decorative etching.

A further refinement is to provide a rough plated skirt that covers not only the top surface of the support post, but also wraps around the base of the tip. This construction not only creates a high contrast between the tip surface and the post but also provides for mechanical support of the tip in the form of a thickening or gusset around its base. The gusset further protects the tip from mechanical failure at its base caused by lateral forces during use, which is particularly useful if the tip has a high aspect ratio (height to width or diameter). This skirt may also be plated in a pattern that slightly overhangs the post structure so that slight misalignments (e.g., due to lithography errors) do not result in the exposure of the smooth reflective surface in the shape of a crescent or edge at one side of the perimeter of the post.

BRIEF DESCRIPTION OF THE DRAWINGS

FIG. 15 illustrates an embodiment of the tip design of the present invention.

FIG. 16 illustrates another embodiment of the tip design of the present invention.

FIG. 17A illustrates a perspective view of another embodiment of the tip design of the present invention.

FIG. 17B illustrates a cut-away view of the Figure of 17A.

DETAILED DESCRIPTION

Figure 1:
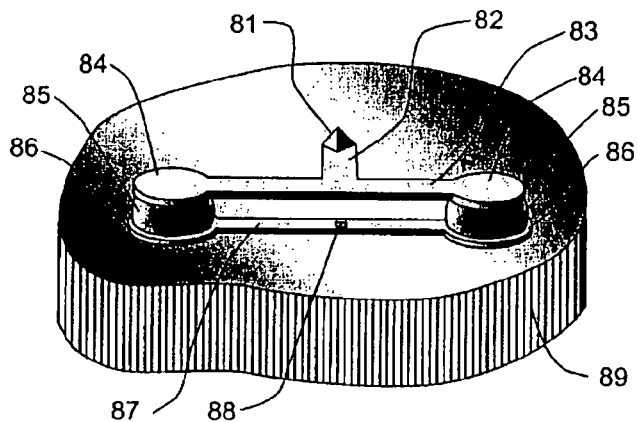
FIGS. 1-5B are examples of embodiments of the prior art.
Figure 2A:
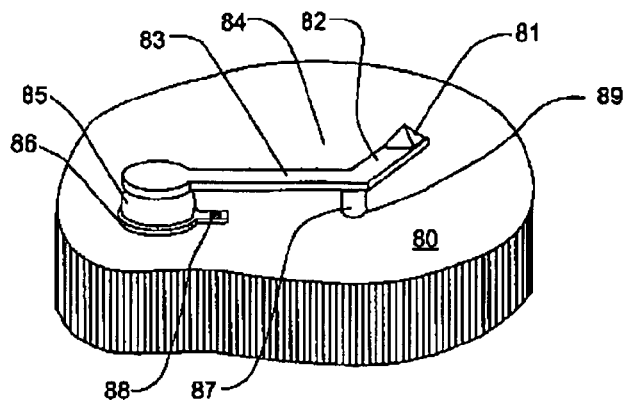
Figure 2B:
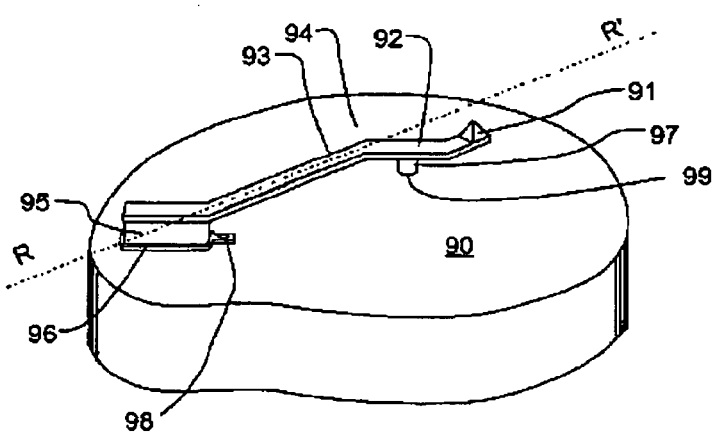
Figure 3A:
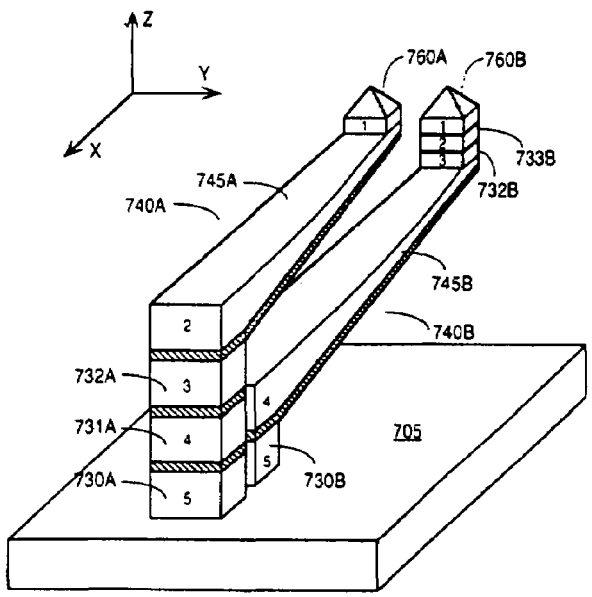
Figure 3B:
Figure 4:
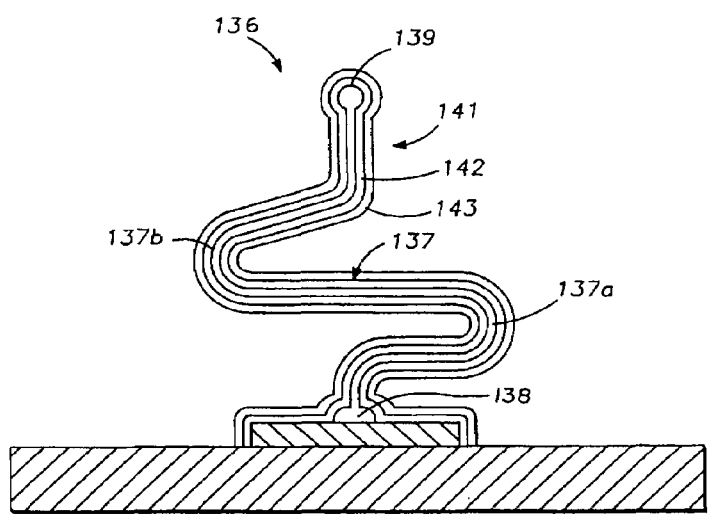
Figure 5A:
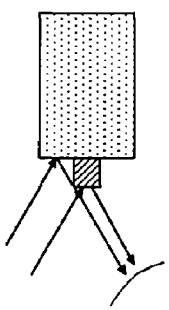
Figure 5B:
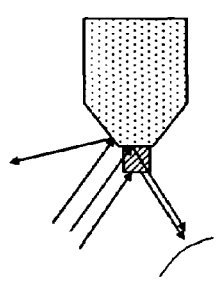
Figure 6A:
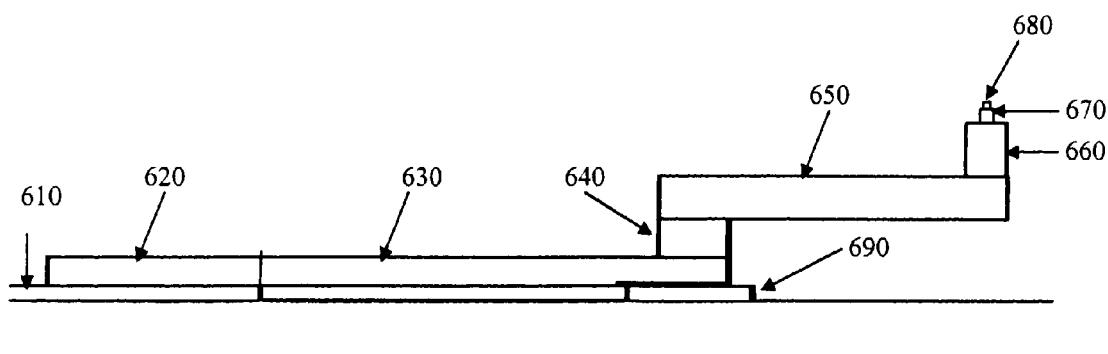
FIG. 6A illustrates a side view of an embodiment of the present invention.

FIG. 6A shows a probe for testing an electronic device in accordance with an embodiment of the present invention. This embodiment of the probe incorporates a substrate 600, a trace layer 610, a foot element 620, a torsion bar 630, a spacer element 640, an arm 650, a post 660, a secondary post 670, a tip 680, and a stop element 690. Plated on a substrate 600 is a trace layer 610 providing an electrically conductive path from the foot 620 to a via 900 (see FIG. 9) in the substrate 600. This trace layer 610 may be electroplated gold having a nominal height (also termed thickness) of 16 um. The foot 620 provides the mechanical anchor for the probe. The foot 620 has both a proximal end (the end closest to the via 900) and a distal end (the end furthest from the via 900). The foot 620 is connected to a torsion bar 630 at its distal end. The torsion bar 630 is the element which provides the probe with its spring like (or compliant) qualities because when it is in an actuated state (i.e., when the probe is contacting an I/O pad of a semiconductor device), the torsion bar 630 will twist as is shown in FIGS. 14A-14E. In one embodiment, the torsion bar 630 is non-axially aligned with the foot 620. In one embodiment, the torsion bar 630 is at an angle of about 10 to about 90 degrees relative to the foot 620, but preferably it is at about a 20 degree angle. This non-axial placement provides an increased strength in the attachment between the foot 620 and the substrate 600, by increasing the moment arm of the attachment, and thereby lessening the peeling forces imparted by the torsion bar 630 on the foot/substrate interface during operation. The torsion bar 630 is raised off of the substrate 600 so that it is not touching it. At its distal end, the torsion bar 630 may have a lateral support element 920 (see FIGS. 9 and 10) which will be used in conjunction with the stop 690 to prevent lateral displacement of the torsion bar 630 during actuation.

At the distal end (again, the side that is furthest from the via 900) the torsion bar 630 is coupled to a spacer element 640. The spacer element raises the arm element 650 off from the plane of the torsion bar 630. The spacer element 640 provides design flexibility towards controlling the path of the motion of the tip 680. It also provides the clearance required between the arm 650 and the substrate 600 to accommodate a full range of compliance. On top of the spacer 640, is the arm element 650. The arm element 650 is plated generally non-axial to the torsion bar 630; In one embodiment, the arm 650 is at an angle of about 20 to about 160 degrees relative to the torsion bar 630, and preferably the angle is about 120 degrees. The arm 650 is designed to be rigid so that it does not act as a spring. If the arm 650 were especially flexible, its deformation would contribute to increasing the scrub beyond the desired limit. In this regard, the arm 650 may be made of a higher modulus metal (for example, W) than the torsion bar 630 (formed from, for example, NiMn), or it may be made shorter, thicker (increasing the height) or wider (or any combination) than the torsion bar 630 as in the preferred embodiment. In this regard, the length, thickness, and width can be expressed in the three axes of three-dimensional Cartesian coordinates, conventionally denoted the x, y, and z axis. The x-axis represents the length, the y-axis represents the width, and the z-axis represents the thickness.

The fact that the arm 650 is on a different plane than the torsion bar 630 is a novel feature of the present invention. This feature is made possible by the use of the photolithography process described in U.S. patent application Ser. Nos. 11/019, 912 and 11/102,982, which are incorporated herein by reference.

Atop the distal end of the arm 650, a first post 660 is plated. The first post element 660 also provides design flexibility in controlling the path of the motion of the tip 680 during actuation. The first post 660 may have a tip 680 plated on top of it, or there may be a second (or more) post element(s) 670, optionally having a smaller surface area than the first post element 660, plated between the first post 660 and the tip 680. The post element (either a first post 660 or combined with the secondary post element 670) extends the tip 680 vertically away from the arm 650 allowing the full target deflection of the tip. The secondary post 670 may be added to the first post 660 to allow proper geometries for tip scrub while maintaining manufacturability. The first post 660 may be plated large enough to allow lithography and plating with a roughly (or slightly larger) 1:1 aspect ratio (width to height). The secondary post 670 is ideally smaller in order to more adequately accommodate a proper scrub. A smaller secondary post 670 also accommodates lithographic alignment errors between the two post layers.

The tip 680 does not need to be concentric with whichever post (660 or 670) it is plated on. It may be advantageous to plate the tip 680 offset from the center of the post (660 or 670) upon which it is plated in order to eliminate any interference the post (660 or 670) may have with the device under test due to the deflection angle. The tip 680 may be circular, rectangular, blade-shaped, oval, teardrop shaped, or any other shape that can be formed lithographically.

Figure 10:
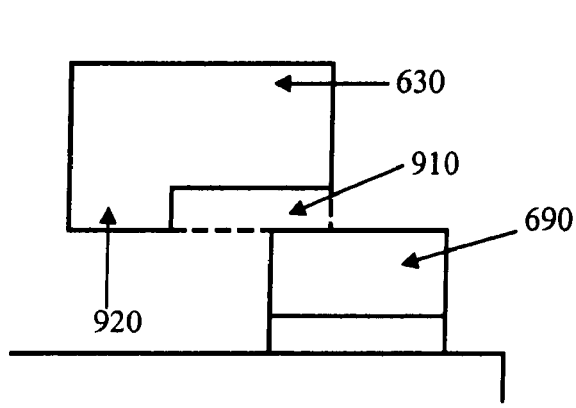
FIG. 10 illustrates an embodiment of the stop element of the present invention.
Figure 11:
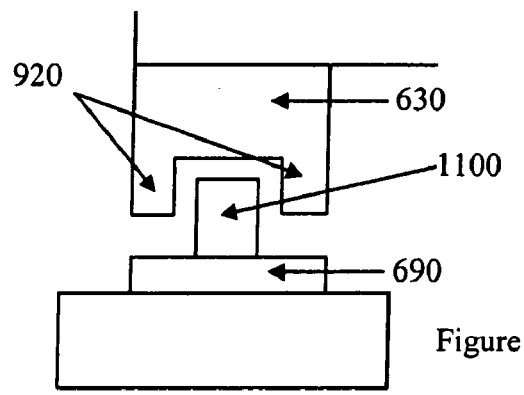
FIG. 11 illustrates another embodiment of the stop element of the present invention.
Figure 12:
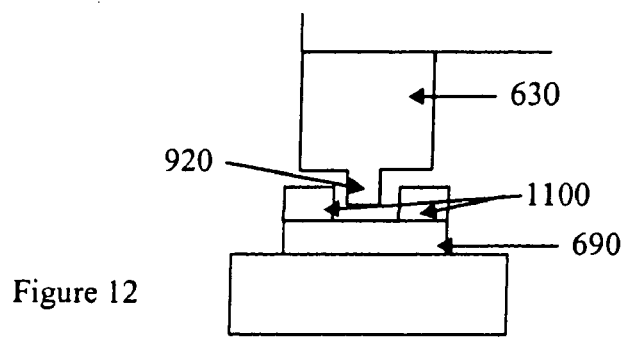
FIG. 12 illustrates another embodiment of the stop element of the present invention.
Figure 14A:
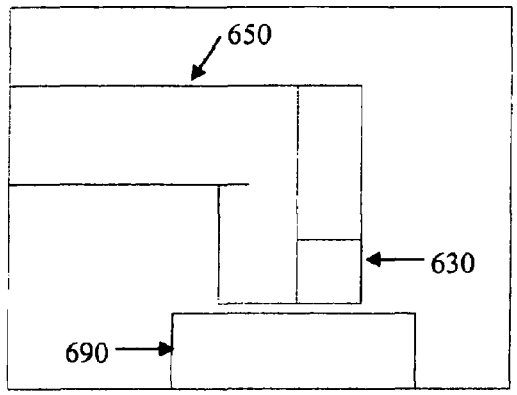
FIGS. 14A-14E illustrates the twisting of the torsion bar as an embodiment of the invention is placed in an actuated stated.
Figure 14B:
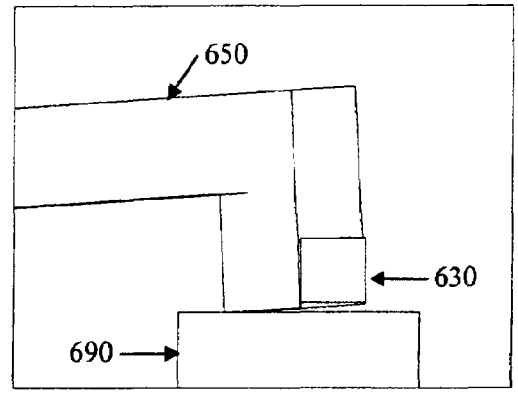
Figure 14C:
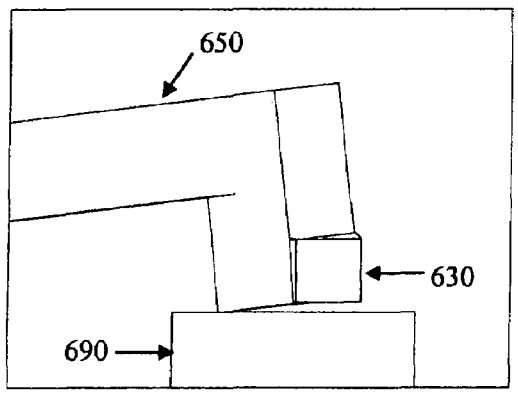
Figure 14D:
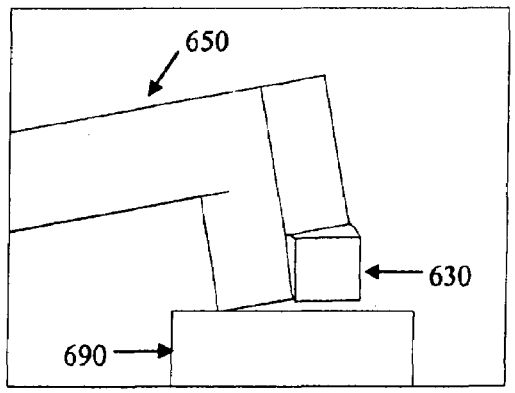
Figure 14E:
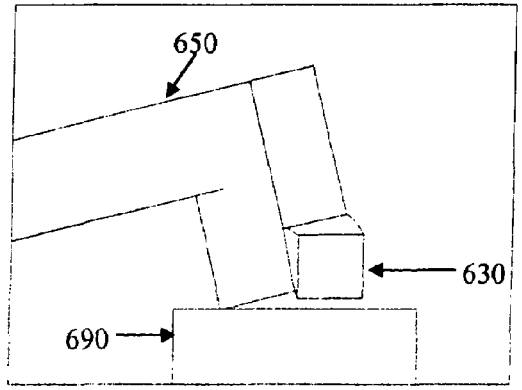

Underneath the arm 630 is a stop element 690. The stop element 690 is plated on the substrate 600 and there is a gap 910 (see FIGS. 9 and 10) between the arm 630 and the stop 690. The gap 910 may be formed by plating approximately 1 um to approximately 20 um of sacrificial copper between the stop 690 and the torsion bar 630 during manufacture, and preferably about 6 um of sacrificial copper is plated. The sacrificial metal will then be removed in the final stages of production of the probe. The stop 690 is designed to provide vertical and lateral support to the torsion bar 630 when the probe is in an actuated state. The basic function of the stop 690 is to act as a fulcrum or pivot for the torsion bar 630. In one implementation, the stop 690 is partially "buried" under the torsion bar 630 in a shallow pocket formed by the lateral support element 920 of the torsion bar 630 (see FIGS. 9 and 10). In another embodiment, the stop 690 is completely placed under the distal end of the torsion bar 630 (see FIG. 11). In the latter embodiment, the stop 690 may also incorporate a lateral support element 1100 and the torsion bar 630 may incorporate two lateral support elements 920 on either side of the stop lateral support element 1100. This embodiment laterally supports the torsion bar 630 in both the positive and negative x directions, providing better lateral stability and scrub mark position accuracy. FIG. 12 also shows another embodiment of the stop element 690. In this embodiment, the torsion bar 630 has one lateral support element 920 and the stop 690 has two lateral support elements 1100 on either side. Other stop configurations providing a pivot while constraining lateral motion may be implemented without departing from the spirit of this invention.

Figure 6B:
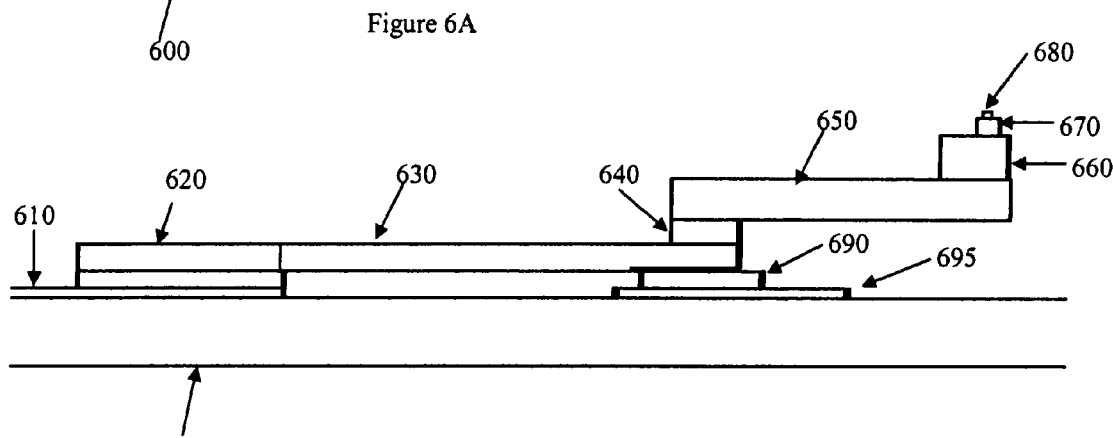
FIG. 6B illustrates a side view of another embodiment of the present invention.

FIG. 6B depicts an alternative embodiment of the present invention. In this alternative embodiment, a second trace layer 695 (which may be connected to trace layer 610) is also plated underneath the stop 690. The purpose of this second trace layer 695 is so that the stop layer 690 can be plated in the same plane as the foot 620. This feature also reduces the thickness of the spacer element 640

Figure 6C:
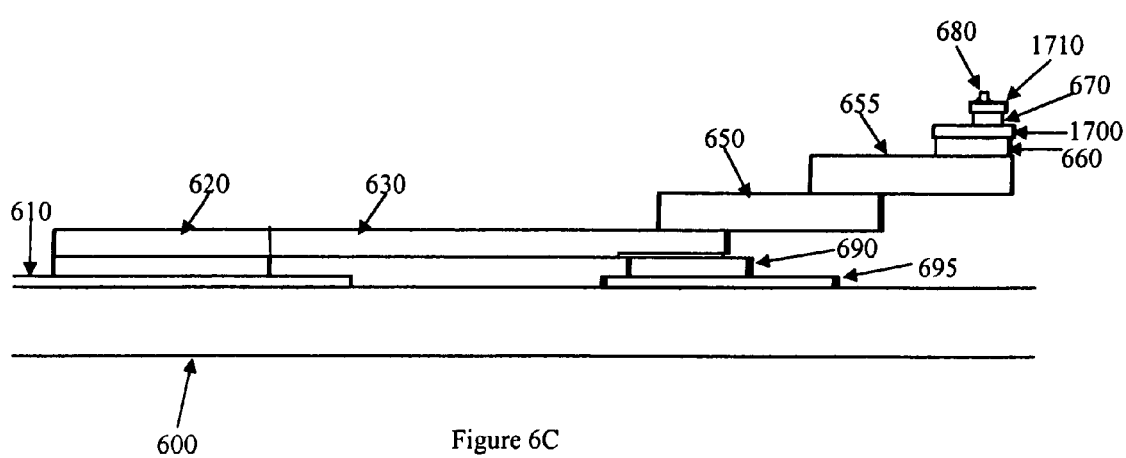
FIG. 6C illustrates a side view of another an embodiment of the present invention.
Figure 13A:
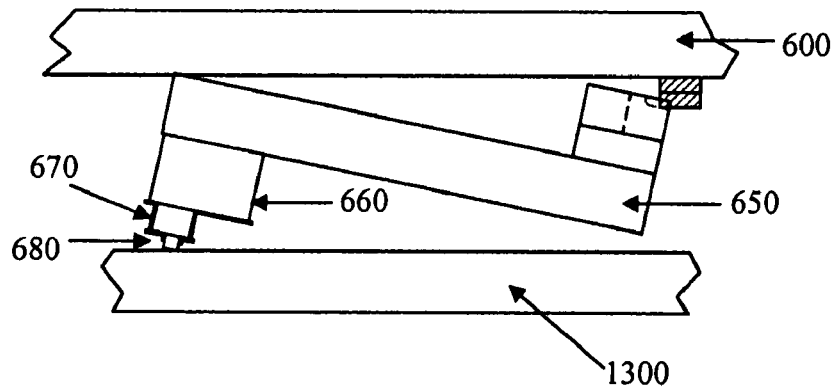
FIG. 13A shows a side view of the embodiment of FIG. 6A in an actuated state.
Figure 13B:
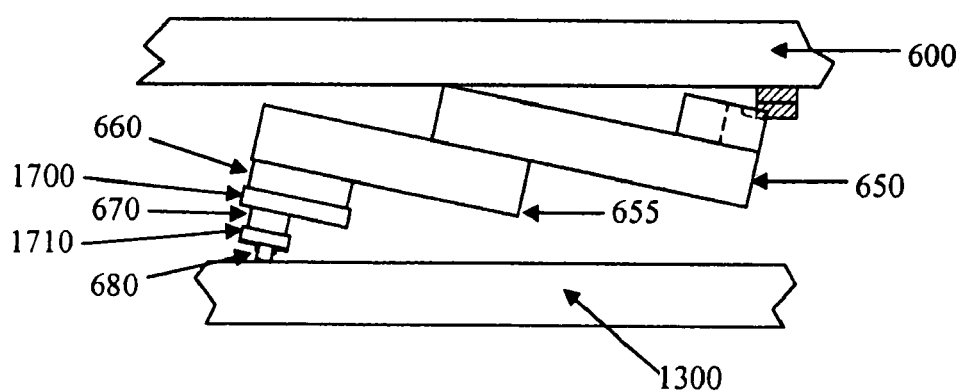
FIG. 13B shows a side view of the embodiment of FIG. 6C in an actuated state.

FIG. 6C depicts an alternative embodiment of the present invention. This alternative embodiment is substantially the same as FIG. 6B but shows a probe element with a first arm 650 attached to the torsion bar 630 and a second arm 655 that sits at the distal end of the first arm 650. Because of the dual arm structure, a spacer 640 is not necessary. The dual-arm feature allows for greater clearance between the closest part of the probe structure and the wafer under test. Additional clearance can help avoid damage to the wafer surface from foreign particles caught between the probe structure and the wafer surface in the actuated state. This is graphically shown in FIGS. 13A and 13B. FIG. 13A shows an embodiment like that in FIG. 6A or 6B. In one embodiment, the proximal end of the arm 650 (the end furthest from the tip 680) may be less than 20 um from the wafer under test 1300. In FIG. 13B, the lowest part of the second arm 655 may be roughly 45 um from the wafer under test 1300 and the lowest part of the arm 650 may be roughly 56 um from the wafer under test 1300. In both FIGS. 13A and 13B, it is assumed that the probe structure traveled 100 um which is the distance between the substrate 600 and the lowest part of the arm (or first arm) 650.

One could increase the height of the posts 660, 670 in order to create greater clearance between the wafer surface and the probe structure, but this is undesirable because it increases scrub length and adds process complexity and cost. While the embodiment shown in FIG. 6C shows a dual arm structure, a probe may be constructed with many more arms without parting from the spirit of the present invention. It is also possible to replace the post with a short arm (the difference being that a post has roughly equal length and width or may be round while an arm is substantially longer than it is wide).

Figure 7A:
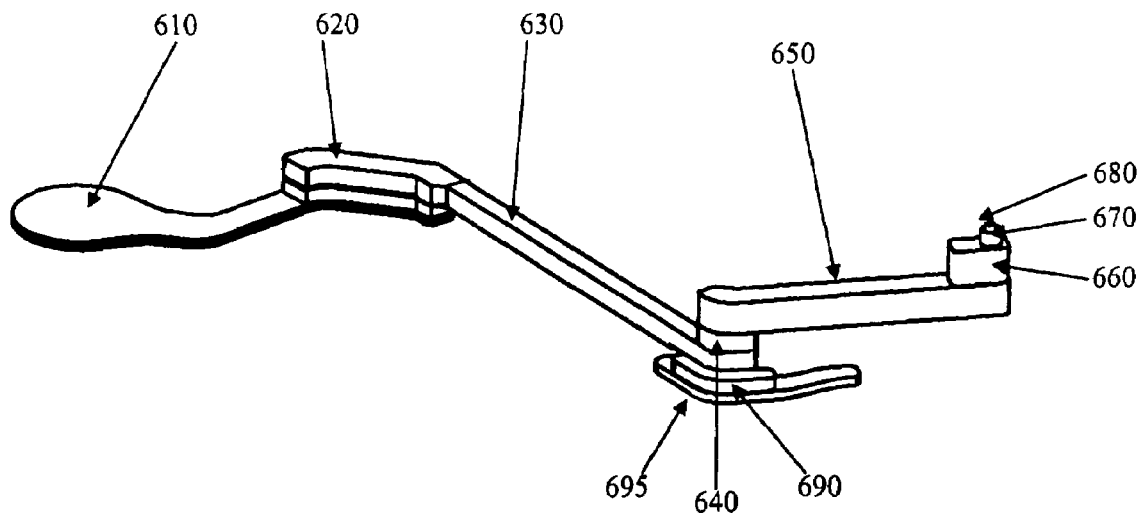
FIG. 7A illustrates a perspective view of the embodiment of the invention shown in FIG. 6B.

FIG. 7A depicts the embodiment of FIG. 6A from an angle which shows the non-axial alignment of the torsion bar 630 to the foot 620, and the non-axial alignment of the arm 650 to the torsion bar 630.

Figure 7B:
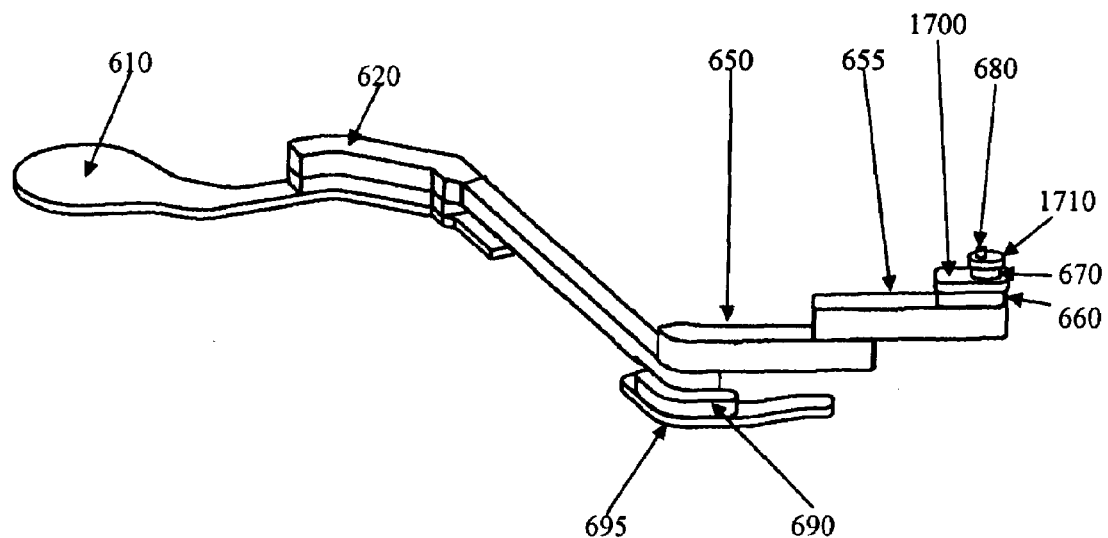
FIG. 7B illustrates a perspective view of the embodiment of the invention shown in FIG. 6C.

FIG. 7B depicts the embodiment of FIG. 6C from an angle which shows the non-axial alignment of the torsion bar 630 to the foot 620, and the non-axial alignment of the arms 650 and 655 to the torsion bar 630.

Figure 8:
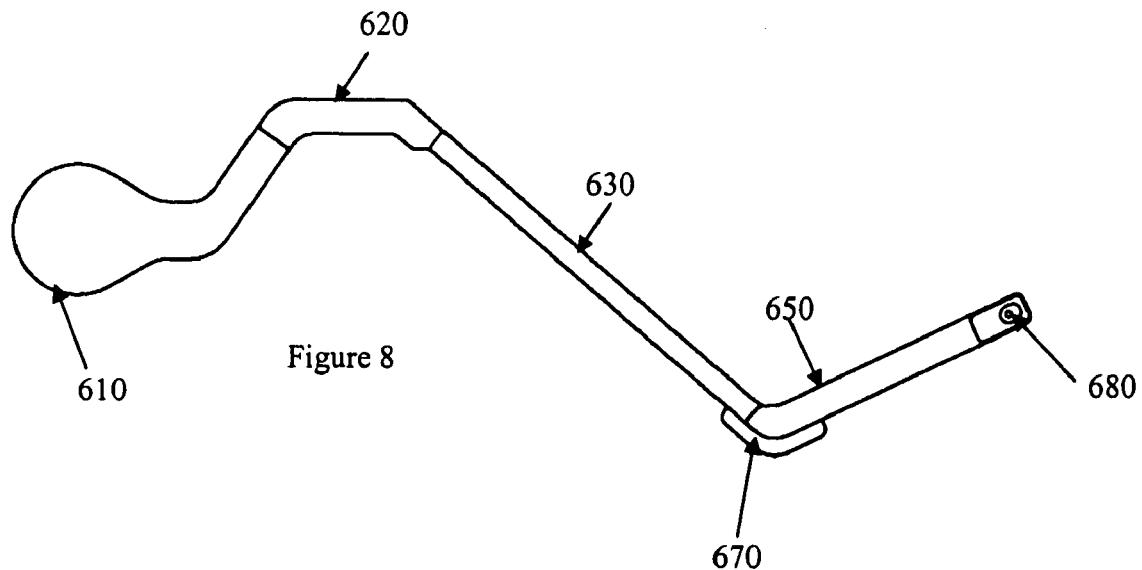
FIG. 8 shows a top down view of the embodiment of FIG. 6A.

FIG. 8 shows a top down view of the embodiment of the present invention shown in FIG. 6A.

Figure 9:
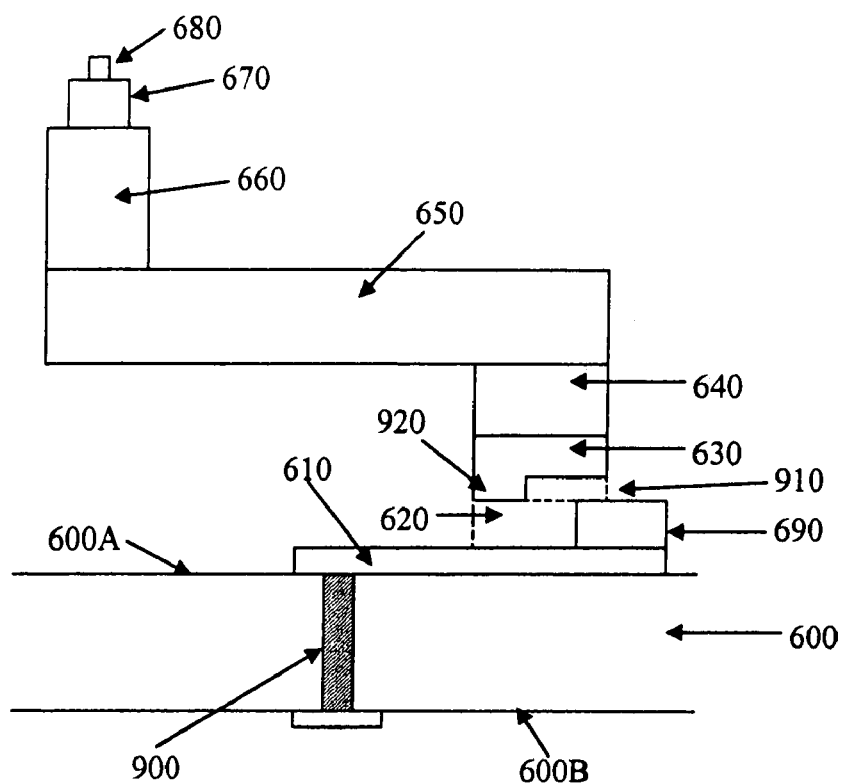
FIG. 9 shows a view of the embodiment of the invention in FIG. 6A, as seen from the front of the stop element.

FIG. 9 is a perspective view of Figure of 6A. It is the view of FIG. 6A one would see if he was looking straight-on at the stop 690 with the torsion bar 630 being behind the stop 690.

In an embodiment of the present invention shown in FIG. 6A the trace layer 610 may be a layer of Ni or NiMn plated 25 um high which in turn may also be plated on a conductive base layer that may be 2000 A Cr under 5000 A of Au under 15 um of electroplated Au. The stop 690 maybe a layer of Ni or NiMn plated to a height of 28 um, and the foot 620 may be plated in two sections: one plated at the same time as the stop 690, the other plated at the same time as the torsion bar 630. Overall, the foot 620 may be a layer of Ni or NiMn (or a combination of both) plated to a height of 67 um. The torsion bar 630 may consist of NiMn that is 39 um high. It should be understood that this is the thickness (in height) of the torsion bar 630, not the height of the torsion bar from the plane of the substrate 600. The torsion bar 630 may also be 40 um in thickness and 804 um in length. NiMn is a useful alloy for the creation of the torsion bar 630 because of its spring like qualities. The arm 650 may be NiMn or Ni plated to a height of 60 um, a width of 55 um and a length of 473 um. The first post 660 may be Ni or NiMn plated to a height of 68 um and the second post 670 maybe be Ni or NiMn plated to 28 um. The tip 680 may be PdCo or Rh plated to a thickness of 11 um or it may be a combination of Ni or NiMn and RdCo or Rh totaling 11 um in thickness.

In the embodiment of the Figure of 6A, there may be a distance of 100 um from the top plane of the arm 650 and the top plane of the tip 680. There may also be a distance of 110 um between the top plane of the substrate 600 and the bottom plane of the arm 650. The total distance from the top plane of the tip 680 and the top plane of the substrate 600 may be 270 um.

In the embodiment of FIG. 6C, the distance between the top plane of the first arm 650 and the top plane of the tip 680 may be 148 um and the distance between the top plane of the second arm 655 and the top plane of the tip 680 may be 93 um. The distance between the top plane of the substrate 600 and the bottom plane of the second arm 655 may be 125 um.

While the forgoing dimensions give approximate dimensions for exemplary embodiments of the present invention, the actual dimensions may be varied by as much as ten times without significantly altering the design principles utilized. While Ni is utilized to make a majority of the probe element in the above examples, many other metals and metal alloys such as NiMn, Tungsten Alloys, and Cobalt alloys may also be used. In general, it is desirable to use metals that can be electroformed and that provide good mechanical strength, toughness and thermal stability.

The substrate 600 may be any type of substrate, including semiconductor materials such as silicon, germanium and gallium arsenide, ceramics such as alumina, aluminum nitride, glass bonded ceramics, low temperature cofired ceramics (LTCC) and high temperature cofired ceramics (HTCC), dielectric coated metals or glasses. The substrate 100 is preferably a Low Temperature Co-fired Ceramic (LTCC) substrate with built in vias 900 such that electricity may be conducted from one face 600a of the substrate 600 to the other face 600b of the substrate 600 by way of the vias 900. In an embodiment of the present invention, the vias 900 are made from gold, but any other conductor such as copper, tungsten or platinum may be used. The ceramic may also contain electrical redistribution conductors, making it an electrical wiring board or "space transformer" as is commonly known in the art.

Another novel feature of the present invention is the design of the tip and post structures on the probe. The quality and reliability of the electrical contact to a semiconductor I/O pad is a function of the tip material, tip size, tip geometry, scrub motion, and contact force. Each of these parameters has a bearing on the contact performance, but tip geometry is among the most significant and is a function of the fabrication technology employed. Older contactors, such as cantilever needle probes or vertical buckling beam probes were typically built from wire with a sharpened or shaped tip. However, this type of tip geometry is difficult to control at the micron scale and requires high contact force which is deleterious to the semiconductor devices under test. Furthermore, pin based contactors cannot be built at the fine pitches and high pin counts required for modern wafer test. For these and other reasons, microfabricated probe contactors are an attractive alternative. New microfabricated spring contactors often have smooth planar surfaces in close proximity to the contact surface which creates difficulty for automatic vision systems to easily identify the tip due to reflections from surfaces other than the tip. The new post and tip designs of the present invention overcome this common problem.

Figure 18:
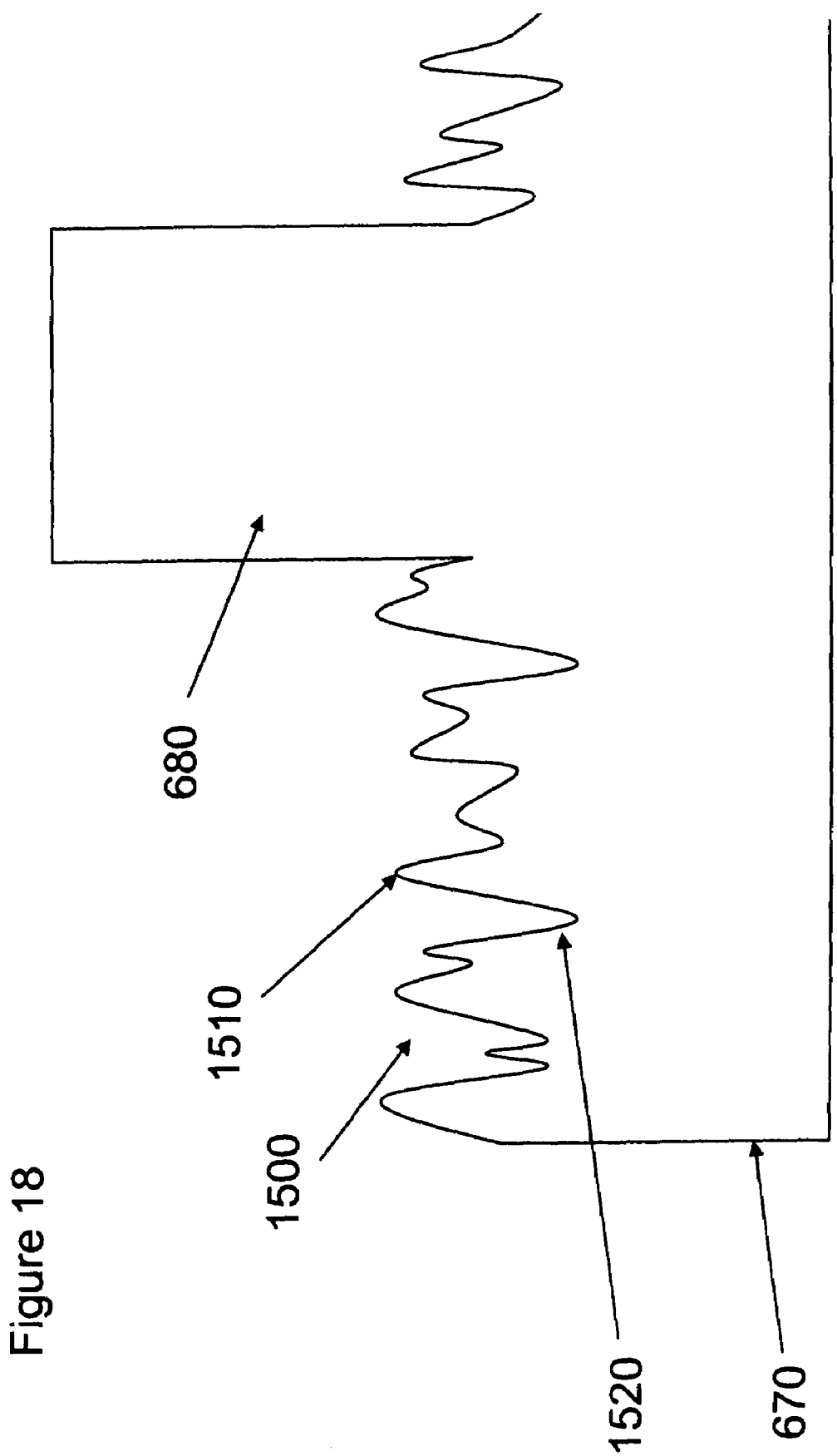
FIG. 18 illustrates a close-up view of an embodiment of the tip design of the present invention.

FIG. 15 shows one embodiment of the tip and post design of the present invention. In FIG. 15, the bottom (in the view shown) of the post 670 has a roughened surface 1500. The surface is roughened prior to lithographically pattern-plating the tip 680 on the post 670, and so the tip 680 is plated directly on the roughened surface 1500. The roughened surface 1500 can be formed by plating metals and alloys such as Ni, Ni alloys such as NiMn, NiCo, NiW, or NiFe, W alloys such as CoW, Cr or similar metals at a high current, or by the addition of grain refiners or other additives such as Mn salt in a Ni Sufamate bath, or in any other manner known in the art of electroplating and electroforming to create a roughened surface. As shown in FIG. 18 (not drawn to scale), the roughened surface 1500 may have peaks 1510 and valleys 1520 and a peak 1510 may rise up approximately 0.1 um to approximately 5 um from a valley 1520, and preferably the height is approximately 1 um from peak 1510 to valley 1520. The arrows in FIG. 15 denote light (the solid lines indicate intense light, the dashed lines indicate diffused, diffracted, absorbed, or in some other way, less intense light). Thus, FIG. 15 shows that the light reflected back from the roughened surface 1500 is diffused and scattered. This helps the automatic vision systems to resolve the tip 680 more clearly by providing greatly improved contrast between the tip and the post surface(s).

A further refinement to this idea is depicted in FIG. 16. In FIG. 16, a rough plated skirt 1720 is plated on the bottom portion of the post 670 and also around the base of the tip 680. This construction creates a high contrast between the surface of the tip 680 and the post 670 and also provides for mechanical support of the tip 680 in the form of a thickening or gusset around the base of the tip 680. The gusset further protects the tip 680 from mechanical failure at its base caused by lateral forces during use, particularly if the tip 680 has a high aspect ratio (height to width or diameter).

FIGS. 17A and 17B depict another embodiment of the tip and post design of the present invention. In FIGS. 17A and B a roughened metal is plated in a cap 1710, 1700 over the posts 670, 660 so that the metal overhangs the post structures. This fabrication method insures that slight misalignments (due to lithography errors) do not result in the exposure of the smooth reflective surfaces of the posts 660,670 which could cause a crescent or edge at one side of the perimeter of the posts 660, 670.

While the description above refers to particular embodiments of the present invention, it should be readily apparent to people of ordinary skill in the art that a number of modifications may be made without departing from the spirit thereof. The accompanying claims are intended to cover such modifications as would fall within the true spirit and scope of the invention. The presently disclosed embodiments are, therefore, to be considered in all respects as illustrative and not restrictive, the scope of the invention being indicated by the appended claims rather than the foregoing description. All changes that come within the meaning of and range of equivalency of the claims are intended to be embraced therein.

What is claimed is:

1. A probe for making electrical connection to a contact pad on a microelectronic device comprising:
   a torsion bar lying in a first horizontal plane and having a top surface and a bottom surface; and
   an arm coupled to the torsion bar, said arm lying in a second horizontal plane and having a top surface and a bottom surface, said bottom surface of the arm lying in a higher horizontal plane than the top surface of the torsion bar, and said arm being more rigid than the torsion bar.

2. The probe of claim 1, wherein the second plane is about parallel with the first plane.

3. The probe of claim 1, wherein the torsion bar is the primary energy storing element.

4. The probe of claim 1, wherein the torsion bar is non-axial with the arm.

5. The probe of claim 4, wherein the torsion bar is at about a 120 degree angle with the arm.

6. A probe for making electrical connection to a contact pad on a microelectronic device comprising a design which transforms an arc motion of a tip into a twisting motion of a torsion bar, wherein the torsion bar lies in a first horizontal plane and has a top surface and a bottom surface and the tip is electrically connected to an arm which lies in a second horizontal plane and has a top surface and a bottom surface, said bottom surface of the arm lying in a higher horizontal plane than the top surface of the torsion bar, said arm coupled to the torsion bar, and said arm being more rigid than the torsion bar.

7. The probe of claim 6, wherein the first plane is substantially parallel to the second plane.

8. A probe contactor comprising:
a foot coupled to a substrate:
a torsion bar lying in a first horizontal plane and having a top surface and a bottom surface, coupled to the foot at a first end of the torsion bar, and which is supported by the foot;
a partial support coupled to the substrate at a second end of the torsion bar, said second end being at a longitudinal opposite end of the torsion bar, the partial support providing support to the torsion bar only in a translation of the torsion bar;
a rigid arm, lying in a second horizontal plane and having a top surface and a bottom surface, coupled to the torsion bar at the second end of the torsion bar, said bottom surface of the arm lying in a higher horizontal plane than the top surface of the torsion bar; and
a tip electronically coupled to the rigid arm.

9. The probe contactor of claim 8, wherein the partial support supports the second end of the torsion bar in a direction perpendicular to the substrate.

10. The probe contactor of claim 9, wherein the partial support constrains the motion of the torsion bar in a direction orthogonal to the longitudinal axis of the torsion bar.

11. The probe contactor of claim 10, wherein the partial support supports the torsion bar while allowing the second end of the torsion bar to rotate along the longitudinal axis of the torsion bar.

12. A probe for making electrical connection to a contact pad on a microelectronic device comprising:
a torsion bar lying in a first plane;
an arm lying in a second plane, said arm being more rigid than the torsion bar; and
a spacer, having a bottom surface connected to the torsion bar and a top surface connected to the arm, said second plane being in a different plane than said first plane.

13. The probe of claim 12, wherein the torsion bar is the primary energy storing element.

14. The probe of claim 12, wherein the torsion bar is non-axial with the arm.

15. The probe of claim 14, wherein the torsion bar is at about a 120 degree angle with the arm.

16. The probe of claim 12, said spacer being coupled to a distal end of said torsion bar and being coupled to a proximal end of said arm.

17. A probe contactor comprising:
a foot coupled to a substrate:
a torsion bar lying in a first plane, coupled to the foot at a first end of the torsion bar, and which is supported by the foot;
a partial support coupled to the substrate at a second end of the torsion bar, said second end being at a longitudinal opposite end of the torsion bar, the partial support providing support to the torsion bar only in a translation of the torsion bar;
a rigid arm, lying in a second plane, coupled to the torsion bar at the second end of the torsion bar, said second plane being a different plane than the first plane;
a spacer, having a bottom surface connected to the torsion bar and a top surface connected to the arm; and
a tip electronically coupled to the rigid arm.

18. The probe contactor of claim 17, wherein the partial support supports the second end of the torsion bar in a direction perpendicular to the substrate.

19. The probe contactor of claim 17, wherein the partial support constrains the motion of the torsion bar in a direction orthogonal to the longitudinal axis of the torsion bar.

20. The probe contactor of claim 17, wherein the partial support supports the torsion bar while allowing the second end of the torsion bar to rotate along the longitudinal axis of the torsion bar.

21. The probe contactor of claim 17, said spacer being coupled to a distal end of said torsion bar and being coupled to a proximal end of said arm.

* * * * *